United States Patent
Ramirez (10) Patent No.: US 9,548,671 B2
(45) Date of Patent: Jan. 17, 2017

(54) VOLTAGE BOOSTER FOR UTILITY METER

(71) Applicant: Landis+Gyr, Inc., Lafayette, IN (US)

(72) Inventor: Anibal Diego Ramirez, Indianapolis, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 167 days.

(21) Appl. No.: 14/327,186

(22) Filed: Jul. 9, 2014

(65) Prior Publication Data

US 2016/0013726 A1 Jan. 14, 2016

(51) Int. Cl.
*G01R 21/06* (2006.01)
*H02M 5/04* (2006.01)
*H02M 7/06* (2006.01)
*H02M 1/00* (2006.01)

(52) U.S. Cl.
CPC ............... *H02M 5/04* (2013.01); *G01R 21/06* (2013.01); *H02M 7/06* (2013.01); *H02M 2001/0006* (2013.01)

(58) Field of Classification Search
CPC ..... G01R 21/06; G01R 15/186; G01R 22/063; G01R 15/183; G01R 21/133; H02M 7/06; H02M 5/04; H02M 3/1582; H01F 27/422; H02J 3/14
USPC ........................................................ 324/142
See application file for complete search history.

(56) References Cited

U.S. PATENT DOCUMENTS

| | | | | |
|---|---|---|---|---|
| 4,730,287 A | * | 3/1988 | Yoshino ................. | G04G 19/02 368/205 |
| 6,504,357 B1 | * | 1/2003 | Hemminger ............. | G01D 4/00 324/142 |
| 6,687,627 B1 | * | 2/2004 | Gunn ................... | G01R 21/133 324/500 |
| 2006/0145685 A1 | * | 7/2006 | Ramirez ................. | H02J 3/14 324/142 |
| 2009/0015234 A1 | * | 1/2009 | Voisine ................ | H01F 27/422 323/355 |

* cited by examiner

*Primary Examiner* — Arleen M Vazquez
*Assistant Examiner* — Brent J Andrews
(74) *Attorney, Agent, or Firm* — Maginot, Moore & Beck LLP (57) ABSTRACT

A utility meter configured for connection to an AC power line includes a meter housing with a plurality of electronic components arranged within the meter housing and configured to provide consumption data. A power supply is also arranged within the meter housing. The power supply is configured to receive an AC voltage from the AC power line and supply a DC voltage to the electronic components. An AC line voltage booster is positioned connected to the power supply. The AC line voltage booster is configured to increase the voltage from the AC power line received by the power supply.

20 Claims, 5 Drawing Sheets

VOLTAGE BOOSTER FOR UTILITY METER

FIELD

This application relates to the field utility meters and more particularly to power sources for utility meters.

BACKGROUND

Utilities, including electrical, water, and gas utilities monitor customer consumption through meters. In particular, electrical utilities monitor electrical energy consumption, water utilities monitor water consumption, and gas utilities monitor gas consumption. Utilities use the consumption information primarily for billing, but also for resource allocation planning and other purposes.

Modern utility meters, including electricity meters, typically include numerous solid state electronics components and associated electronic devices including sensor devices, data processors, microcontrollers, memory devices, clocks, and communications devices. These electronic devices are used for various purposes within the meter, including consumption calculation, data storage, and communications. In association with these electronic devices, the utility meters also include a power supply configured to provide DC power to the electronic devices.

A typical onboard power supply utilized in electricity meters is a wide range switching power supply. A single wide range switching power supply may supply the power for the solid state electronics components including data acquisition hardware and communications hardware. Switching power supplies also store DC energy used to sustain operation of the meter for some limited amount of time in the event of a power-down event.

Most utility meters are configured for use with AC power line voltages of 96 Vrms or more (e.g., 96 Vrms to 552 Vrms on the supply line). However, in some instances a utility meter may be connected to a supply line that provides significantly less than 96 Vrms. A low voltage line providing less than 96 Vrms (e.g., a line providing 40 Vrms) may occur when there is a problem with electricity production from the utility provider, with transmission equipment in the power distribution grid, or in substation metering applications outside the U.S. market.

SUMMARY

In accordance with one embodiment of the disclosure, there is provided a utility meter including a utility meter configured for connection to an AC power line. The utility meter comprises a meter housing with a plurality of electronic components arranged within the meter housing and configured to provide consumption data. A power supply is also arranged within the meter housing. The power supply is configured to receive an AC voltage from the AC power line and supply a DC voltage to the electronic components. An AC line voltage booster is positioned inside of the meter housing and connected to the main power supply. The AC line voltage booster is configured to increase the voltage from the AC power line received by the main power supply.

Pursuant to another embodiment of the disclosure, an arrangement is provided for measuring electrical energy consumption from an AC power line. The arrangement includes an electricity meter and an AC line voltage booster. The electricity meter includes a power supply and a plurality of electronic components arranged within a meter housing. An AC line voltage booster is positioned inside of the meter housing and connected to the power supply. The AC line voltage booster includes a first lead connected to one phase line of the AC power line, a second lead connected to a neutral line of the AC power line, a third lead connected to a first input terminal of the power supply of the electricity meter, and a fourth lead connected to a second input terminal of the power supply of the electricity meter.

According to yet another embodiment of the disclosure, a method is provided for boosting voltage provided to a power supply in an electricity meter connected to an AC power line. The electricity meter includes the power supply and electronic components associated with an energy measurement circuit arranged within a meter housing. The method includes increasing the voltage provided to the power supply by connecting an AC line voltage booster to the electricity meter inside of the housing. Connecting the AC line voltage booster to the electricity meter includes (i) connecting a first lead of the AC line voltage booster to one phase line of the AC power line, (ii) connecting a second lead of the AC line voltage booster to a neutral line of the AC power line, (iii) connecting a third lead of the AC line voltage booster to a first input terminal of the power supply of the electricity meter, and (iv) connecting a fourth lead of the AC line voltage to a second input terminal of the power supply of the electricity meter.

The above described features and advantages, as well as others, will become more readily apparent to those of ordinary skill in the art by reference to the following detailed description and accompanying drawings. While it would be desirable to provide a utility meter that provides one or more of these or other advantageous features, the teachings disclosed herein extend to those embodiments which fall within the scope of the appended claims, regardless of whether they accomplish one or more of the above-mentioned advantages.

DESCRIPTION

Figure 1:
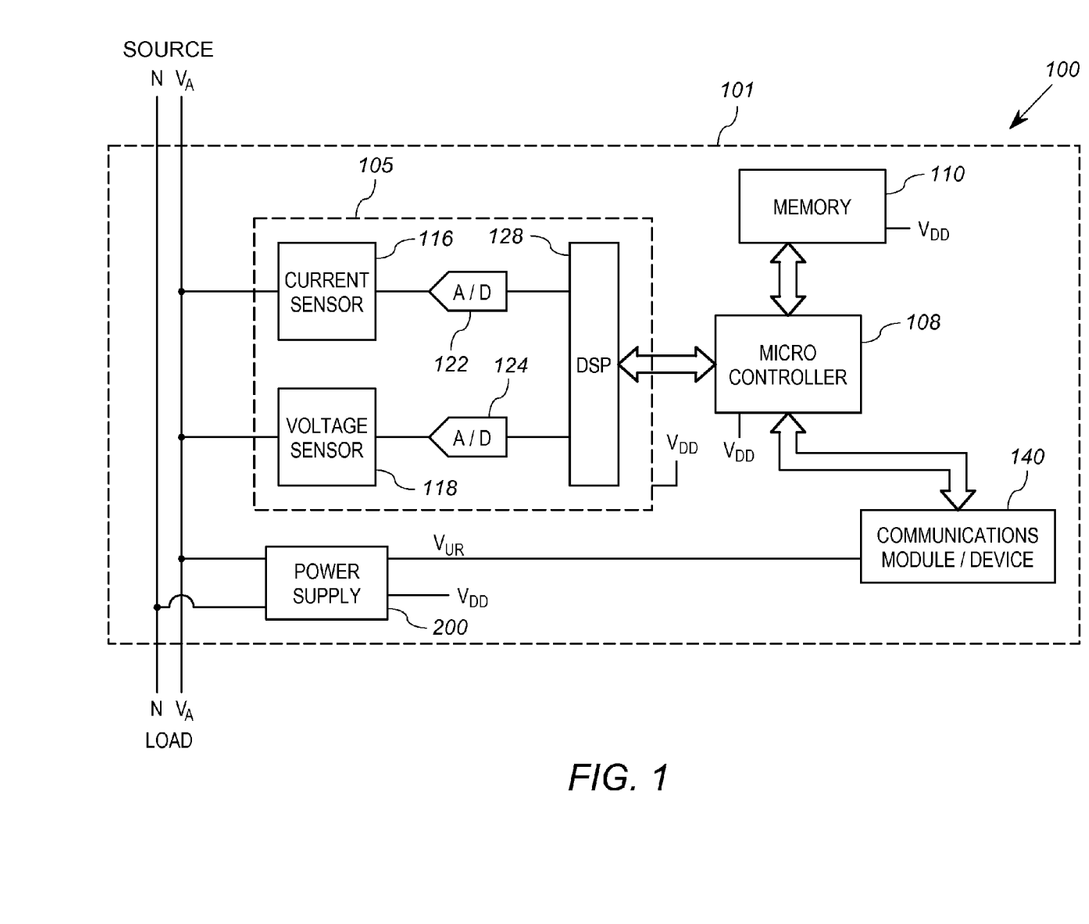
FIG. 1 shows a block diagram of an exemplary utility meter including a measurement circuit, a microprocessor, a memory, a communications module, and a power supply.

With reference to FIG. 1, an exemplary utility meter is shown in the form of an electricity meter 100. The electricity meter 100 is configured to measure power consumption by a load. The exemplary meter 100 includes a measurement circuit 105, a processor/microcontroller 108, a memory circuit 110, a communication module/device 140, and a power supply 200. The measurement circuit 105, the processor/microcontroller 108, the memory circuit 110, the communication module/device 140, and the power supply 200 may all be provided on a single circuit board (e.g., a main electronics board) or on multiple boards within the housing 101 of the utility meter 100. The utility meter 100 is configured to measure electrical power delivered on a power line $V_A$ from a source (i.e. the utility) to a load (i.e., the customer). It will be noted that the single-phase electricity meter 100 is given by way of example only in FIG. 1. It will be recognized that those of ordinary skill in the art may readily adapt aspects of the disclosed embodiment to other types of meters, such as three phase electricity meters or other types of utility meters.

As shown in FIG. 1, the measurement circuit 105 includes a current sensor 116, a voltage sensor 118, a first analog-to-digital ("A/D") converter 122, a second A/D converter 124, and digital signal processor 128. The current sensor 116 is coupled to the power line $V_A$ and configured to receive signals indicative of the current flowing through the power line. To this end, the current sensor 116 of the exemplary embodiment described herein may include a transformer situated to detect current on the power line. The voltage sensor 118 is coupled to the power line $V_A$ and configured to obtain a voltage measurement therefrom. To this end, the voltage sensor 118 may suitably comprise a high resistance voltage divider. Alternatively, the voltage sensor 118 may be a potential transformer. Analog signals from the current sensor 116 and the voltage sensor 118 are delivered to the A/D converters 122 and 124, where the signals are converted into digital signals and passed onto the digital signal processor 128. The digital signal processor 128 (which may also be referred to herein as "metering IC") generates digital signals that are delivered to the microprocessor/controller 108. These digital signals provide consumer consumption data and other data to the microprocessor 108. For example, the digital signals from the digital signal processor 128 to the controller may include power consumption, voltage and current signals.

The controller 108 is operably configured to execute programming instructions, receive the digital signals from the measurement circuit 105, monitor and record power consumption using the digital signals, and analyze the digital voltage and current measurement signals and associated phase angle data to determine whether one or more measurement errors is present. The controller 108 generally includes firmware, or in other words, an integrated memory into which programming instructions are stored. Alternatively, the programming instructions may be stored in the memory 110. In the embodiment of FIG. 1, the measurement circuit 105 and the controller 108 are shown as distinct components, but it will be recognized by those of skill in the art that the controller 108 may be considered part of the measurement circuit 105. Also, the digital signal processor 128 may be provided as part of the microcontroller 108 or on a single integrated circuit board (e.g., the main electronics board) with the microcontroller 108.

The memory 110 is configured to store data, and the controller 108 is configured to deliver data to the memory or retrieve data from the memory 110. Accordingly, software routines for the controller 108, metrology data, and other data that may be useful for the meter 100 may be stored in the memory 110. The memory may be provided using any of various known devices such as a flash memory or other non-volatile memory.

The communications module 140 provides for communication of the consumer consumption data and other data between the meter and another entity external to or remote from the meter, such as other devices in a communications network. For example, in at least one embodiment, the communications module 140 may be provided on an automatic meter reading (AMR) board and the communications network may be an AMR network. The communications module 140 may include a plurality of different communications devices, such as a transceiver circuit including a wireless transmitter, wireless receiver and one or more A/D converters. The transceiver circuit may be configured to receive a signal from an external entity, such as AMR communications network, and deliver the received signal to the processor 108. The transceiver circuit is also configured to transmit a signal received from the processor 108 to the external entity, such as AMR communications network. The transceiver may include, for example, an RF transceiver operable to perform the above-described functions. However, it will be recognized that numerous other transceivers may be utilized, such as transceivers for power line communications, phone line communications, or other types of communications used in the art.

Figure 4:
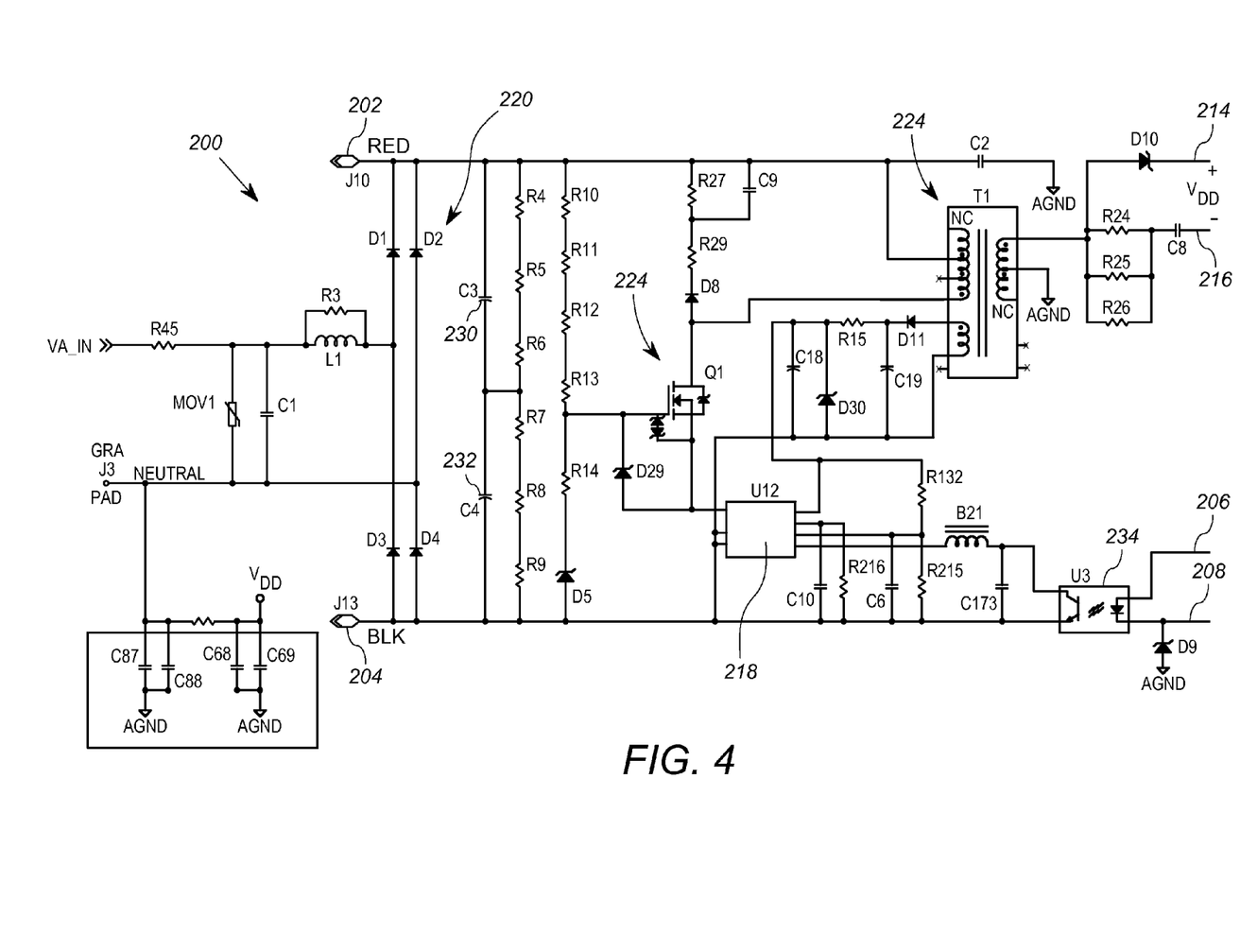
FIG. 4 shows a schematic arrangement for the power supply of FIG. 1.

The meter 100 further includes a power supply 200 that is configured to generate bias power for the measurement circuit 105, the controller 108, the memory circuit 110, and any other elements of the meter 100 requiring DC power. Such a power supply 200 may suitably be a switched mode power supply circuit that converts AC line voltage received from the electrical power lines to suitable DC voltages used within the meter (but not by the customer). Accordingly, the power supply 200 may also be referred to herein as an "offline switcher." As noted in the block diagram of FIG. 1, the DC voltages provided by the offline switcher 200 may include an unregulated DC voltage $V_{UR}$ as well as a regulated DC voltage $V_{DD}$ provided by a voltage regulator. Such power supply circuits are known to those of ordinary skill in the art, and an exemplary arrangement for such a power supply circuit is shown in FIG. 4. As noted in the block diagram of FIG. 1, the regulated DC voltage $V_{DD}$ is used to supply DC bias voltages for the microcontroller 108, memory 110, and components of the measurement circuit 105. In at least one exemplary embodiment $V_{DD}$ provided by the offline switcher is +12V DC.

Figure 2:
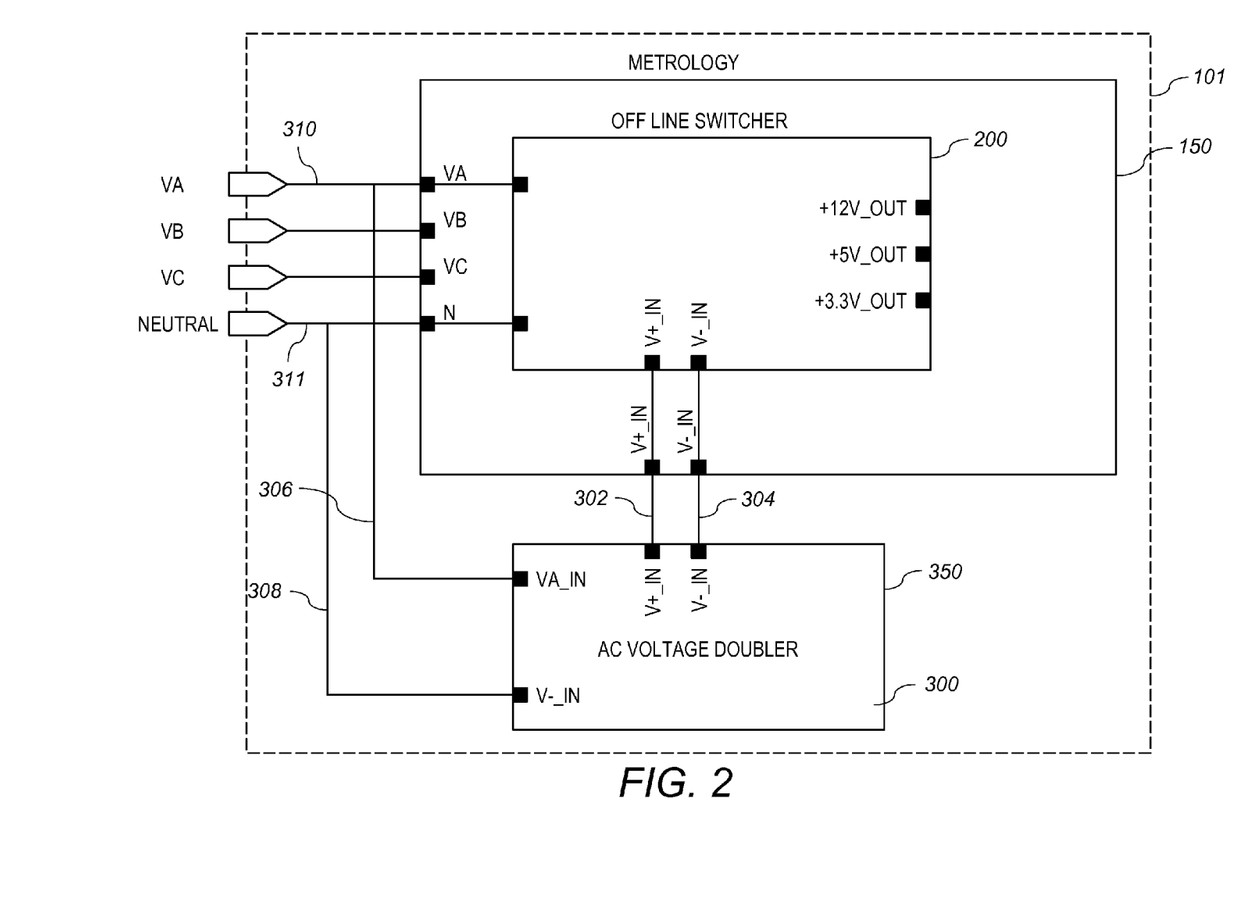
FIG. 2 shows a block diagram of a voltage booster configured for connection to the power supply of the utility meter of FIG. 1; (make sure to indicate that the voltage booster is within the electricity meter. The voltage booster is a separate, optional electronics assembly, board that is either configured at the factory or retrofitted in the field to meet specific customer requirements of lower operating voltages)

With reference now to FIG. 2, an exemplary main electronics board 150 is shown with the offline switcher 200 isolated on the board 150. An AC line voltage booster 300 is shown connected to the off-line switcher 200. The AC line voltage booster 300 (which may also be referred to herein as simply a "voltage booster") is provided on a board 350 that is separate from the main electronics board 150 and includes four leads, including output leads 302, 304 and input leads 306, 308. The output leads 302, 304 extend between the output of the voltage booster 300 and the power supply 200 on the main electronics board 150. The input leads 306, 308 extend between the voltage booster 300 and the incoming line from the utility provider. In particular, lead 306 extends to one phase of the AC line voltage (e.g., phase "A" noted by wire 310 in FIG. 2) and lead 308 extends to the neutral line (noted by wire 311 in FIG. 2). As used herein, the term "lead" refers to an electrically conductive component leading from one location to another. Accordingly, a "lead" may be provided by a wire, an electrically conductive tab, prong, terminal, or any other electrically conductive member.

Figure 5:
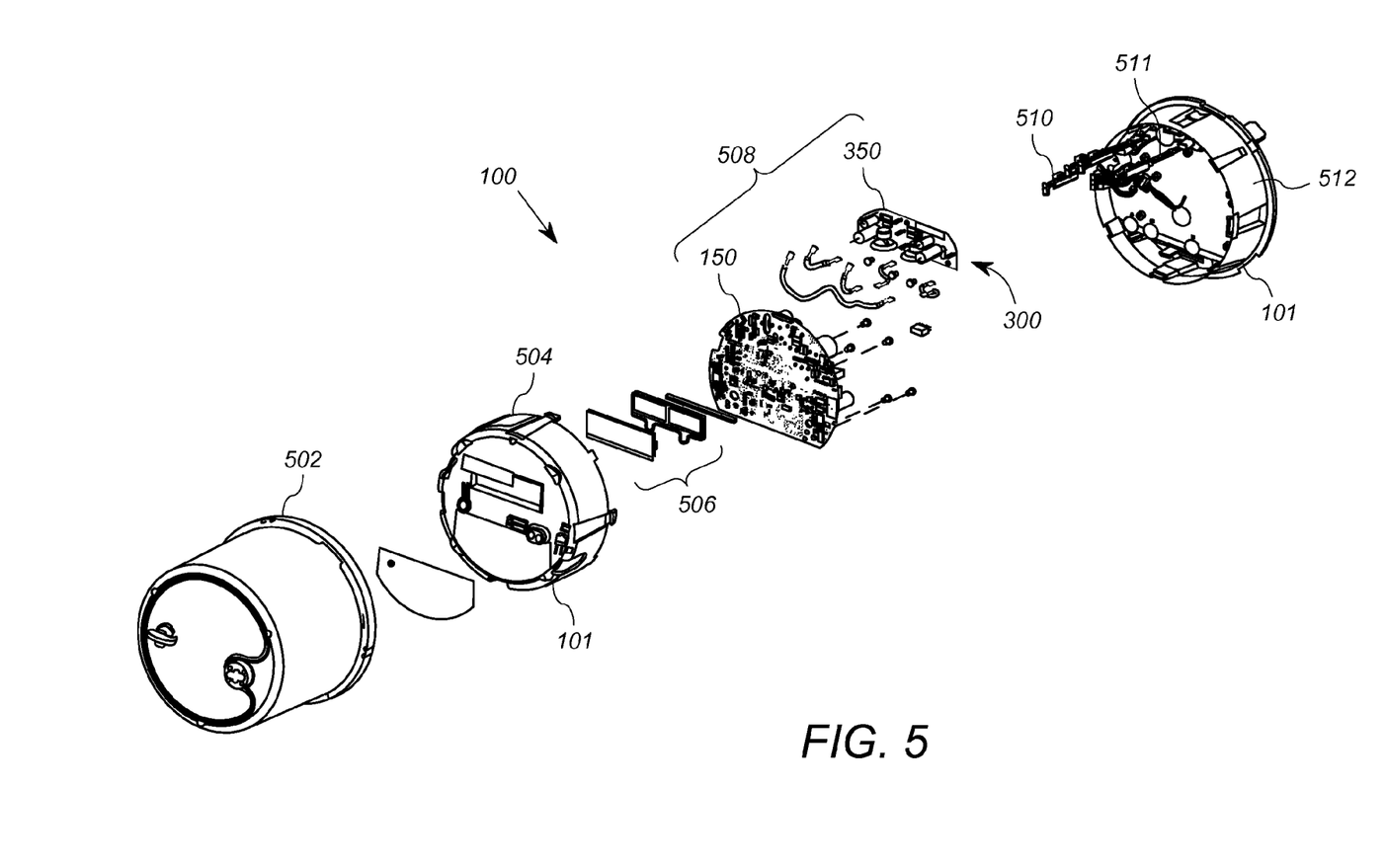
FIG. 5 shows an exploded perspective view of the utility meter of FIG. 1 with the power supply positioned on a main board and the voltage booster of FIG. 2 positioned on a second board.

The input leads 306 and 308 for the voltage booster 300 are provided by two wires with female "fast on" terminals at the end of the wires. One "fast on" terminal is designed to connect to one phase line 310 of the AC power line (e.g., phase line A) and the other "fast on" terminal is configured to connect to the neutral line 311 of the AC power line. These "fast on" terminals (which may also be referred to herein as "quick connect" terminals) connect to preexisting ports or other terminals located in the base of the utility meter 100 housing. Examples of the location of these ports on the utility meter are shown in FIG. 5 as noted by terminals 510 and 511.

The output lines 302, 304 of the voltage booster 300 are attached to the power supply 200 on the main electronics board 150. This may also be accomplished using two female "fast on" terminals that connect to male "fast on" terminals on the main electronics board 150. With reference again to FIG. 5, the main electronics board 150 is shown with the voltage booster board 350 positioned adjacent thereto. As explained in further detail below, both the main electronics board 150 and the voltage booster board 350 may be connected to a meter base assembly 512.

The AC line voltage booster 300 is configured to provide an increased voltage to an existing power supply 200 within the meter 100. In particular, the AC line voltage booster 300 connects to an offline switcher used to provide a DC voltage to various electronic components within the meter 100, including electronic components on the main electronics board 150. Because of the increased voltage provided to the offline switcher, the utility meter 100 may operate at low line voltages (e.g., voltages on the AC power line 40 Vrms to 144 Vrms). Without the voltage booster 300, the utility meter would typically not operate properly at such lower line voltages and could only be used to serve the meter market operating at more standard line voltages (e.g., 96 Vrms to 552 Vrms). Accordingly, the voltage booster 300 allows the meter 100 to be extended in the field for use in low voltage markets (e.g., down to as low as 40 Vrms), thus allowing a single base meter to be available for use in many markets without adding complexity or cost to the base meter product.

Figure 3:
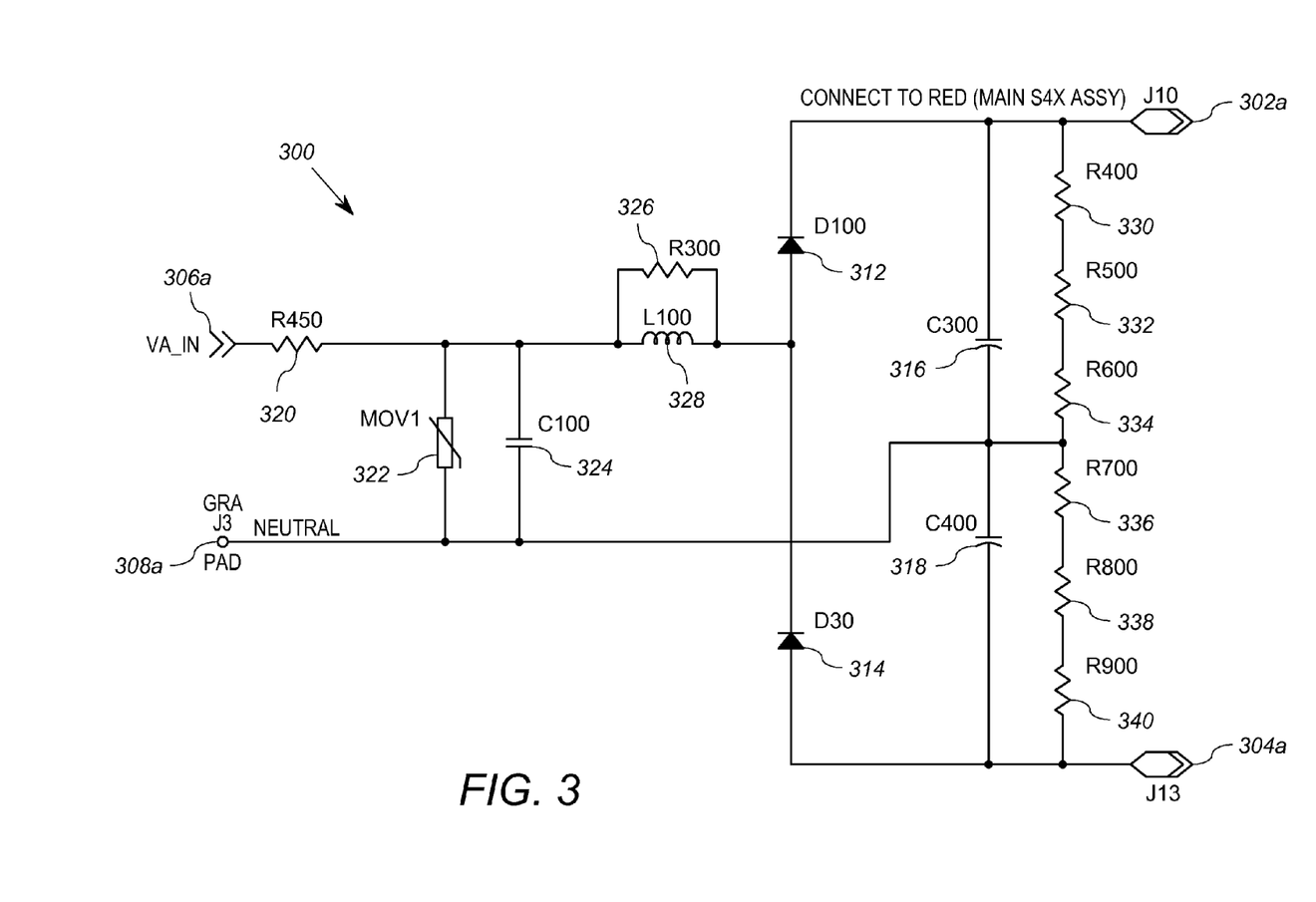
FIG. 3 shows a schematic arrangement for the voltage booster of FIG. 2.

With reference now to FIG. 3, an exemplary circuit arrangement for the voltage booster 300 of FIG. 2 is shown in the form of a voltage doubler. The voltage booster 300 includes an input across terminals 306a and 308a (respectively connected to leads 306 and 308 in FIG. 2) and an output across terminals 302a and 304a (respectively connected to leads 302 and 304 in FIG. 2). The voltage booster 300 further includes two rectifier diodes 312 (D100) and 314 (D200) and two electrolytic capacitors 316 (C300) and 318 (C400) arranged between the input and the output. The two rectifier diodes 312 and 314 along with the two capacitors 316 and 318 generate an open circuit DC voltage across the output terminals 302a (J10) and 304a (J13) that is approximately twice the peak voltage of the input AC voltage provided across terminals 306a and 308a.

In addition to the diodes 312 and 314 and capacitors 316 and 318 that provide the voltage doubling feature for the voltage booster 300, the circuit also includes various additional components that make the voltage booster 300 particularly useful in association with an electricity meter. For example, the voltage booster 300 includes a resistor 320 (R450) connected to the input terminal 306a and a varistor 322 (MOV1) connected between the resistor 320 and the neutral terminal 308a. This resistor 320 and varistor 322 combination provides a high voltage surge protection feature for the voltage booster 300. In particular, the varistor 322 acts as a voltage clamping device that clamps the voltage across its terminals during a surge at the input to the voltage booster (i.e., a voltage surge across terminals 306a and 308a). At the same time, the resistor 320 acts as high voltage current limiting resistor that limits the current flowing through the voltage clamping device. In at least one embodiment the voltage clamping circuit protects against voltage surges of up to 10 kV peak, with the varistor 322 clamping the voltage across its terminals to approximately 1 kV peak. This high voltage surge protection feature is particularly useful because of the direct connection of the voltage booster to the AC power line.

In addition to the above, the voltage booster 300 also includes an EMI filter provided by a capacitor 324 (C100), a resistor 326 (R300) and an inductor 328 (L100). The capacitor 324, resistor 326 and inductor 328 are all connected to the resistor 320 connected to the input terminal 306a. The capacitor 324 is connected in parallel with the varistor 322. The resistor 326 is connected in parallel with the inductor 328 to provide improved EMI filtering. Together, the capacitor 324, resistor 326 and the inductor 328 provide an EMI filter for the voltage booster. This EMI filter is particularly useful in reducing harmonics produced by the offline switcher 200 (see FIG. 2) within the electricity meter 100.

The voltage booster circuit also includes a voltage equalizer network provided by resistors 330 (R400), 332 (R500), 334 (R600), 336 (R700), 338 (R800) and 340 (R900). The resistor 330, 332, 334, 336, 338 and 340 are all provided in a branch of the voltage booster circuit that extends across the output terminals 302a and 302b. The voltage equalizer network, based on resistors, is employed to assure that the working voltage across each series-connected capacitor (e.g., capacitors 316 and 318) is approximately the same. Without this voltage equalizer network, one of the series-connected capacitors may operate at significantly higher or lower voltages that the other, thus reducing the service life of the capacitors.

As mentioned previously, the output terminals 302a and 302b of the voltage booster 300 are connected to the offline switcher 200 provided within the electricity meter 100. An exemplary circuit arrangement for the offline switcher 200 is shown in FIG. 4. As shown in FIG. 4, the off line switcher 200 includes a number of terminals that provides connection to the circuitry of the offline switcher 200, including an AC power line supply terminal 210, an AC power line neutral terminal 212, a first output terminal 214, a second output terminal 216, a second input supply terminal 202 and a second neutral terminal 204. In addition, the offline switcher 200 includes configuration port terminals 206 and 208 that connect to a processor 218 within the power supply 200. The offline switcher 200 also includes a rectifier 220, a transformer 222, and a switcher controller 224, which includes the processor 218. The illustrated rectifier 220 is a full wave rectifier that generates a DC voltage across the terminals 202 and 204 and the high DC voltage capacitors 230 (C3) and 232 (C4). Switcher controller 224 applies the DC voltage to the primary coil of transformer 222 with a variable duty cycle and a scaled rectified amplitude limited signal is present on the secondary coil of transformer. The switcher duty cycle is controlled by a feedback signal generated by optical coupler 234 (U3). As noted previously, the offline power supply 200 provides a regulated DC signal VDD for powering various electronic devices in the meter 100, including the measuring circuit 105, microcontroller 108, and memory 110.

With reference to FIGS. 3 and 4, the terminals 302a and 304a of the voltage booster 300 (shown in FIG. 3) are connected to the terminals 202 and 204 of the offline switcher 200 (shown in FIG. 4). The DC voltage generated by the voltage booster 300 is connected to the existing off line switcher 200 within the meter without the need for any further modification of circuitry within the meter housing. Since the DC voltage generated by the voltage booster 300 is higher than that the DC voltage generated by the offline power supply, the voltage booster 300 sets the DC voltage level across terminals 202 (J10) and 204 (J13) (shown in FIG. 4). This ensures that, even at low AC line voltages (e.g., 40 Vrms), the off line switcher 200 remains fully functional.

With reference now to FIG. 5, an exploded perspective view of the utility meter 100 is shown. The utility meter 100 generally includes a protective front cover 502, a meter housing 101 provided by a front housing assembly 504 and a meter base assembly 512, a display 506, and meter electronics boards 508 including the main electronics board 150 and the voltage booster board 350. The voltage booster board 350 is secured to the meter base assembly 512 with mounting screws or other appropriate fasteners or mounting members. As described above, electrical connections to the phase A line voltage and neutral line may be provided through wire leads with quick connect terminals that are inserted into existing tabs in the meter base assembly (e.g., tabs 510 and 511). The DC output generated by the AC line voltage booster 300 is connected to existing tabs present in the main board assembly 150 that connect to the existing offline switcher 200 within the meter 100. With the voltage booster 300 connected to the off-line switcher 200 within the meter 100, the voltage provided to the offline switcher 200 is increased, thus allowing the offline switcher to provide an adequate supply voltage for the electronic components within the electricity meter. Furthermore, it will be appreciated that the voltage booster 300 is a separate optional electronics assembly that may be added to the existing circuitry of the electricity meter 100 either at the factory or retrofitted in the field to meet specific customer requirements of lower operating voltages. In particular, the voltage booster may be conveniently located on the interior of the housing 504 mounted to the meter base assembly 512 and connected to the offline switcher 200 on the main electronics board 150.

The proposed voltage booster 300 provides a simple, robust, and cost effective arrangement that makes use of the offline switcher already present in an existing electricity meter. Accordingly, electricity meters may be retrofit in the field to include the voltage booster 300 in order to address specialized customer requirements in low voltage situations. Various additional features make the voltage booster even better equipped for field retrofitting including high voltage surge protection and EMI filtering features.

The foregoing detailed description of one or more embodiments of the voltage booster for a utility meter has been presented herein by way of example only and not limitation. It will be recognized that there are advantages to certain individual features and functions described herein that may be obtained without incorporating other features and functions described herein. Moreover, it will be recognized that various alternatives, modifications, variations, or improvements of the above-disclosed embodiments and other features and functions, or alternatives thereof, may be desirably combined into many other different embodiments, systems or applications. For example, although the voltage booster has been described herein as being located internal to the meter housing, other embodiments may be possible where the voltage booster is located external to the meter housing by virtue of connection to various ports that may be available in a given meter. Presently unforeseen or unanticipated alternatives, modifications, variations, or improvements therein may be subsequently made by those skilled in the art which are also intended to be encompassed by the appended claims. Therefore, the spirit and scope of any appended claims should not be limited to the description of the embodiments contained herein.

What is claimed is:

1. A utility meter configured for connection to an AC power line, the utility meter comprising:
   a meter housing;
   a plurality of electronic components arranged within the meter housing on a main electronics board and configured to provide consumption data;
   a power supply arranged within the meter housing on the main electronics board, the power supply configured to receive an AC voltage from the AC power line and supply a DC voltage to the electronic components; and
   an AC line voltage booster positioned inside of the meter housing and connected to the power supply, the AC line voltage booster mounted separate from the main electronics board and configured to provide an input voltage to the power supply.

2. The utility meter of claim 1 wherein the utility meter is an electricity meter, and wherein the electronic components include a measurement circuit with a current sensor and a voltage sensor.

3. The utility meter of claim 1 wherein the AC line voltage booster is configured to generate a DC voltage of about two times a peak voltage of the AC power line.

4. The utility meter of claim 1 wherein the power supply is an off-line switcher including a rectifier and a transformer, and wherein the DC voltage is output from the off-line switcher.

5. The utility meter of claim 1, wherein the AC line voltage booster is connected to power supply via quick connect terminal on the main electronics board.

6. The utility meter of claim 1, wherein the AC voltage booster includes high voltage surge protection circuitry.

7. The utility meter of claim 6, wherein the voltage surge protection circuitry includes a voltage clamping device and a high voltage current limiting resistor that limits the current flowing through the voltage clamping device.

8. The utility meter of claim 7 wherein the voltage clamping device is a varistor with terminals, the varistor configured to clamp the voltage across its terminals during a surge event.

9. The utility meter of claim 1 wherein the AC line voltage booster includes an EMI filter configured to reduced harmonics produced by the power supply.

10. The utility meter of claim 1 wherein the AC line voltage booster includes a voltage equalizer network.

11. The utility meter of claim 1 wherein the AC line voltage booster is mounted to a meter base assembly.

12. An arrangement for measuring electrical energy consumption from an AC power line, the arrangement comprising:
   an electricity meter including a power supply arranged on a first board, the power supply configured to provide a DC voltage to a plurality of electronic components arranged within a meter housing; and
   an AC line voltage booster mounted on a second board that is separate from the first board and connected to the power supply on the first board, the AC line voltage booster including a first lead connected to one phase line of the AC power line, a second lead connected to a neutral line of the AC power line, a third lead connected to a first input of the power supply, and a fourth lead connected to a second input of the power supply.

13. The arrangement of claim 12 wherein the AC line voltage booster is configured to generate a DC voltage of about two times a peak voltage of the AC power line.

14. The arrangement of claim 12 wherein the power supply is an off-line switcher including a rectifier and a transformer, and wherein a DC voltage is output from the off-line switcher.

15. The arrangement of claim 12 wherein the AC line voltage booster includes voltage surge protection circuitry.

16. The arrangement of claim 15 wherein the AC line voltage booster includes an EMI filter configured to reduced harmonics produced by the power supply.

17. The arrangement of claim 16 wherein the AC line voltage booster includes a voltage equalizer network.

18. The arrangement of claim 12 wherein the meter housing includes a meter base assembly and wherein the first board and the second board are mounted to the meter base assembly.

19. A method of boosting voltage provided to a power supply in an electricity meter connected to an AC power line, the electricity meter including the power supply and electronic components associated with an energy measurement circuit, the method comprising:

increasing the voltage provided to the power supply by connecting an AC line voltage booster to the electricity meter, wherein connecting the AC line voltage booster to the electricity meter includes:

connecting a first lead of the AC line voltage booster to one phase line of the AC power line;

connecting a second lead of the AC line voltage booster to a neutral line of the AC power line;

connecting a third lead of the AC line voltage booster to a first input terminal of the power supply of the electricity meter; and connecting a fourth lead of the AC line voltage to a second input terminal of the power supply of the electricity meter.

20. The method of claim 19 wherein a voltage on the AC power line is between 40 Vrms and 144 Vrms.

* * * * *